US009142611B2

(12) United States Patent
Nakanishi

(10) Patent No.: US 9,142,611 B2
(45) Date of Patent: Sep. 22, 2015

(54) SEMICONDUCTOR INTEGRATED CIRCUIT DEVICE

(71) Applicant: PANASONIC CORPORATION, Osaka (JP)

(72) Inventor: Kazuyuki Nakanishi, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 14/309,510

(22) Filed: Jun. 19, 2014

(65) Prior Publication Data

US 2014/0299920 A1    Oct. 9, 2014

Related U.S. Application Data

(63) Continuation of application No. PCT/JP2013/001384, filed on Mar. 6, 2013.

(30) Foreign Application Priority Data

Mar. 8, 2012  (JP) ................................. 2012-051360

(51) Int. Cl.
| | |
|---|---|
| *H01L 29/06* | (2006.01) |
| *H01L 27/118* | (2006.01) |
| *H01L 27/02* | (2006.01) |
| *H01L 27/092* | (2006.01) |

(52) U.S. Cl.
CPC ........ *H01L 29/0607* (2013.01); *H01L 27/0207* (2013.01); *H01L 27/0921* (2013.01); *H01L 27/118* (2013.01); *H01L 27/11807* (2013.01)

(58) Field of Classification Search
None
See application file for complete search history.

(56) References Cited

U.S. PATENT DOCUMENTS

| | | | |
|---|---|---|---|
| 6,399,972 B1 * | 6/2002 | Masuda et al. ................. | 257/206 |
| 6,560,753 B2 | 5/2003 | Barney et al. | |
| 8,907,473 B2 * | 12/2014 | Crowder et al. .............. | 257/729 |
| 2005/0001271 A1 | 1/2005 | Kobayashi | |
| 2005/0051801 A1 | 3/2005 | Shaw et al. | |
| 2006/0131609 A1 | 6/2006 | Kinoshita et al. | |
| 2006/0134853 A1 | 6/2006 | Shaw et al. | |
| 2006/0199325 A1 | 9/2006 | Maeno et al. | |
| 2007/0004147 A1 * | 1/2007 | Toubou et al. ................ | 438/261 |
| 2007/0029621 A1 | 2/2007 | Tatsumi | |

(Continued)

FOREIGN PATENT DOCUMENTS

| | | | |
|---|---|---|---|
| JP | 11-026590 A | 1/1999 | |
| JP | 2004-342757 A | 12/2004 | |

(Continued)

OTHER PUBLICATIONS

International Search Report issued in International Application No. PCT/JP2013/001384 with Date of mailing Apr. 2, 2013, with English Translation.

*Primary Examiner* — Crystal L Hammond
(74) *Attorney, Agent, or Firm* — McDermott Will & Emery LLP

(57) ABSTRACT

The present disclosure provides a layout of a semiconductor integrated circuit device that can assure a lot of substrate contact regions, and can surely suppress latch-up without increasing an area of a whole semiconductor integrated circuit and without significantly decreasing a decoupling capacitance element. In a margin region, a transistor serving as a decoupling capacitance and a substrate contact are disposed as a pair on a P-type well. In the margin region, a transistor serving as a decoupling capacitance and a substrate contact are disposed as a pair on an N-type well.

9 Claims, 12 Drawing Sheets

(56) References Cited

U.S. PATENT DOCUMENTS

| | | | |
|---|---|---|---|
| 2007/0278527 A1* | 12/2007 | Kasama et al. | 257/206 |
| 2010/0117120 A1* | 5/2010 | Yamashita | 257/206 |
| 2010/0187664 A1* | 7/2010 | Polhemus et al. | 257/666 |
| 2012/0168875 A1 | 7/2012 | Tamaru et al. | |

FOREIGN PATENT DOCUMENTS

| | | |
|---|---|---|
| JP | 2006-173478 A | 6/2006 |
| JP | 2006-245390 A | 9/2006 |
| JP | 2007-201258 A | 8/2007 |
| WO | 2011/077664 A1 | 6/2011 |

* cited by examiner

US 9,142,611 B2

SEMICONDUCTOR INTEGRATED CIRCUIT DEVICE

This is a continuation of International Application No. PCT/JP2013/001384, with an international filing date of Mar. 6, 2013, which claims priority of Japanese Patent Application No. 2012-051360, filed on Mar. 8, 2012, the contents of each of which are hereby incorporated by reference.

BACKGROUND

1. Technical Field

The present disclosure relates to a layout of a semiconductor integrated circuit device. More particularly, the present disclosure relates to a technique effective for suppressing latch-up with an area of a semiconductor integrated circuit being reduced.

2. Description of the Related Art

Latch-up recently becomes a significant problem with an advance of microfabrication of a pattern in a manufacturing process of a semiconductor integrated circuit device. The latch-up means a phenomenon in which, since a bipolar parasitic transistor formed in a semiconductor integrated circuit device becomes a thyristor structure, this thyristor is turned on by a trigger such as serge, and excess current keeps on flowing. This phenomenon will be described with reference to FIG. 12.

FIG. 12 is a diagram illustrating a sectional structure of a conventional semiconductor integrated circuit device. N-type well Wn1 and P-type well Wp1 are formed on P-type substrate Sp. P-type diffusion regions Dpd1 and Dps1 and polysilicon PO1 on N-type well Wn1 respectively form a drain, a source, and a gate of P-type MOS transistor Tp1.

Substrate contact Dnn1 supplies a substrate potential of P-type MOS transistor Tp1. Substrate contact Dnn1 and P-type diffusion region Dps1 that is the source of P-type MOS transistor Tp1 are connected to power-supply potential VDD. N-type diffusion regions Dnd1 and Dns1 and polysilicon PO2 on P-type well Wp1 respectively form a drain, a source, and a gate of N-type MOS transistor Tn1. Substrate contact Dpp1 supplies a substrate potential of N-type MOS transistor Tn1. Substrate contact Dpp1 and N-type diffusion region Dns1 that is the source of N-type MOS transistor Tn1 are connected to ground potential VSS.

P-type parasitic bipolar transistor Bp1 and N-type parasitic bipolar transistor Bn1 are generated in the conventional semiconductor integrated circuit. However, node N2 is kept to be power-supply potential VDD by substrate contact Dnn1. Node N1 is kept to be ground potential VSS by substrate contact Dpp1. Each of P-type parasitic bipolar transistor Bp1 and N-type parasitic bipolar transistor Bn1 is connected to a base of the corresponding bipolar transistor. Accordingly, the bipolar transistor is not turned on, so that current does not generally flow through N-type well Wn1, P-type well Wp1, and P-type substrate Sp.

On the other hand, when current I forcibly flows in P-type substrate Sp due to external force such as serge or substrate noise, current flows through node N1. The potential of node N1 increases, whereby N-type parasitic bipolar transistor Bn1 is turned on. Then, current flows through node N2, so that the potential of node N2 decreases. Therefore, P-type parasitic bipolar transistor Bp1 is also turned on, whereby current keeps on flowing through node N1. The phenomenon in which high current keeps on flowing in the semiconductor integrated circuit as described above is called latch-up. The latch-up may entail breakdown of an element required for a CMOS operation.

There is a method for suppressing the latch-up in which as many substrate contacts as possible are assured to prevent an increase in the potential of node N1 and a decrease in the potential of node N2. There is another method in which a space d between the substrate contact region and the diffusion region of the CMOS transistor is reduced to decrease resistance in order that, even if current flows, the increase in the potential of node N1 and the decrease in the potential of node N2 are suppressed.

In a conventional semiconductor integrated circuit, a substrate contact region is regularly disposed beforehand on a transistor array. Then, a circuit element required for the operation of the semiconductor integrated circuit is disposed on a remaining region on the transistor array other than the region where the substrate contact region is disposed. Elements, such as a decoupling capacitance element suppressing power supply noise of the semiconductor integrated circuit, which do not contribute to a logical operation of the semiconductor integrated circuit are disposed on a region (hereinafter referred to as a margin region) other than the substrate contact region and the region where the circuit element required for the operation is disposed. There is another method in which nothing is disposed on the margin region. Such semiconductor integrated circuit devices have been generally known (U.S. Pat. No. 6,560,753).

There has also been known a semiconductor integrated circuit device including a substrate contact region for preventing latch-up formed on a margin region (Unexamined Japanese Patent Publication No. H11-026590).

SUMMARY

However, in a conventional semiconductor integrated circuit, when a region where a substrate contact region is disposed is increased, an area of the substrate contact region to the entire area increases, which entails a problem of an increase in the area of the whole semiconductor integrated circuit.

When the margin region is utilized as the substrate contact region, only the substrate contact region is preferentially disposed in the margin region. Therefore, the number of the decoupling capacitance elements to be disposed is extremely small, which entails another problem of deterioration in resistance to power supply noise.

In view of the above-mentioned problems, the present disclosure aims to provide a layout of a semiconductor integrated circuit device that can assure a lot of substrate contact regions, and can surely suppress latch-up without increasing an area of a whole semiconductor integrated circuit and without significantly decreasing a number of decoupling capacitance elements.

A semiconductor integrated circuit device according to the present includes a plurality of transistors contributing to a logical operation, an element not contributing to the logical operation, and first, second, and third substrate contact regions supplying a substrate potential to the plurality of transistors. In the semiconductor integrated circuit device, a plurality of transistor arrays extending in a first direction are disposed in a line in a second direction orthogonal to the first direction. Each of the plurality of transistor arrays includes the plurality of transistors, the element not contributing to the logical operation, the first substrate contact region, the second substrate contact region, and the third substrate contact region disposed between the first substrate contact region and the second substrate contact region. A substrate contact region is formed in a region adjacent to the first substrate contact region in the second direction and in a region adjacent to the first substrate contact region in a direction opposite to the second direction. A substrate contact region is formed in a region adjacent to the second substrate contact region in the second direction and in a region adjacent to the second substrate contact region in a direction opposite to the second direction. No substrate contact region is formed in a region adjacent to the third substrate contact region in the second direction and in a region adjacent to the third substrate contact region in a direction opposite to the second direction. The element that does not contribute to the logical operation is formed in a region adjacent to the third substrate contact region in the first direction.

The semiconductor integrated circuit device according to the present disclosure can assure a substrate contact region, and suppress latch-up without increasing an area of the entire integrated circuit and without significantly decreasing a number of the elements not contributing to the logical operation.

DETAILED DESCRIPTION OF THE PREFERRED EMBODIMENTS

First Exemplary Embodiment

Exemplary embodiments of the present disclosure will be described in detail below with reference to the drawings.

Figure 1:
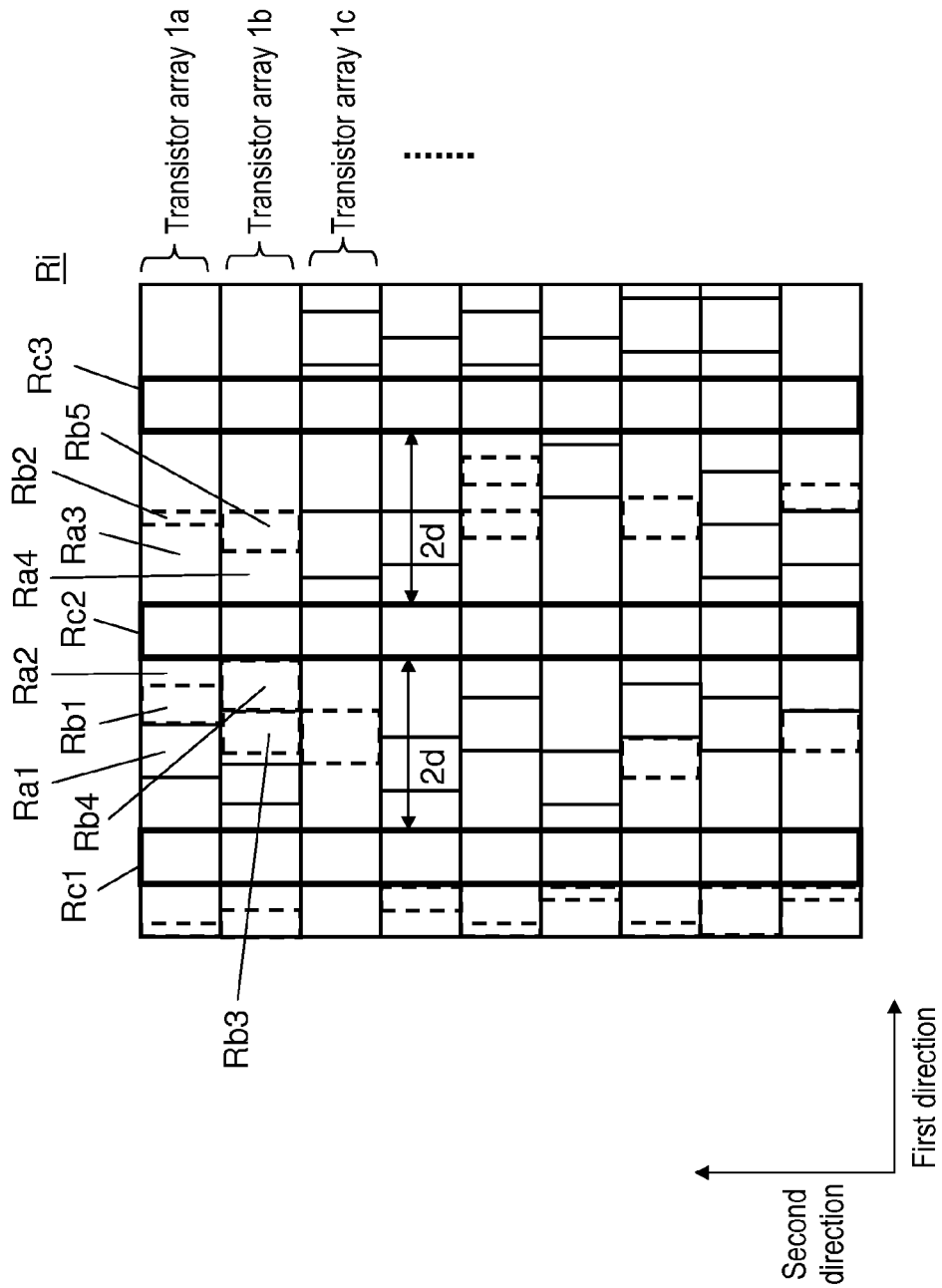
FIG. 1 is a schematic diagram illustrating a layout pattern of a semiconductor integrated circuit device according to a first exemplary embodiment.
Figure 2:
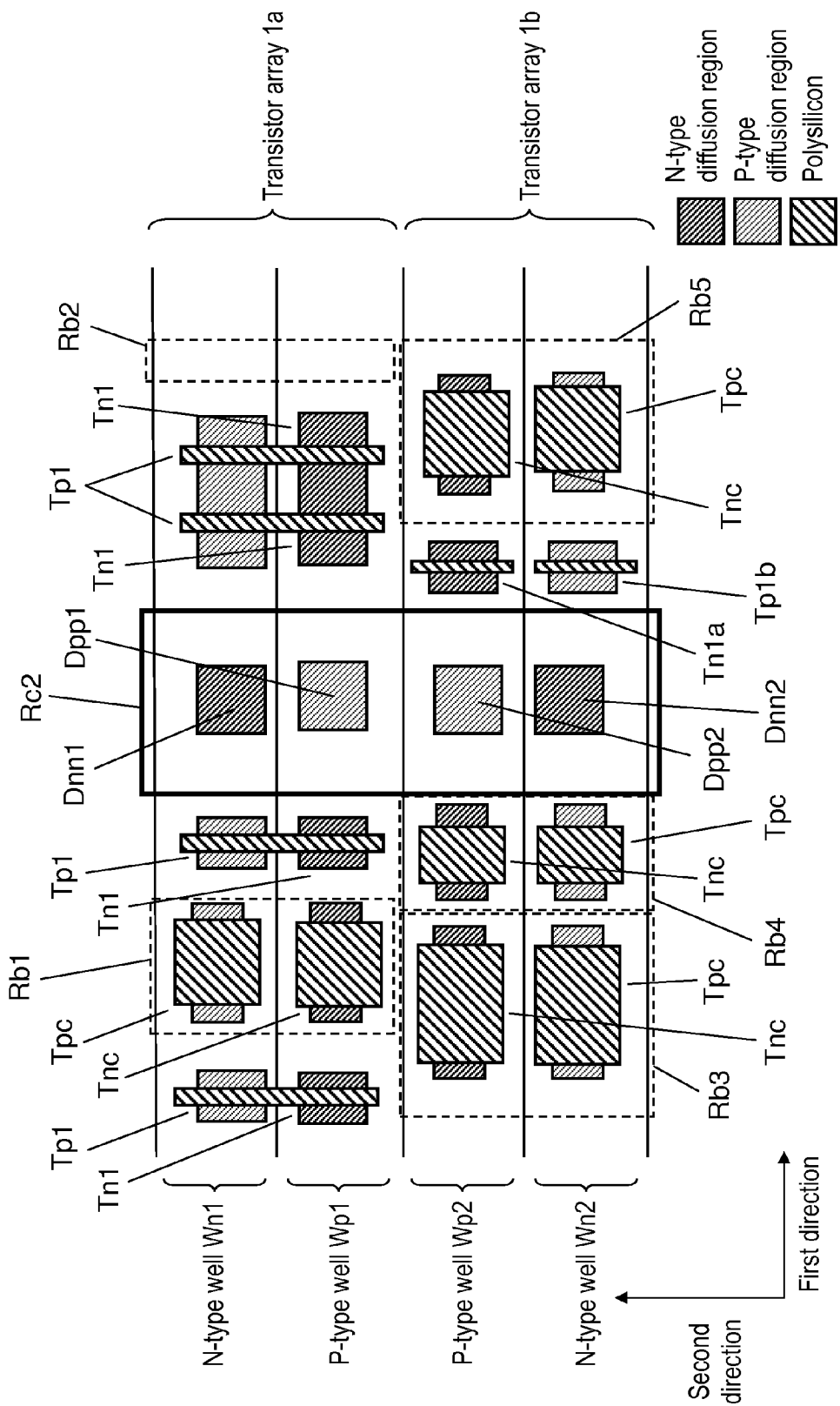
FIG. 2 is a schematic diagram illustrating a layout pattern in which a decoupling capacitance element is disposed in a margin region of the semiconductor integrated circuit device in FIG. 1.
Figure 3:
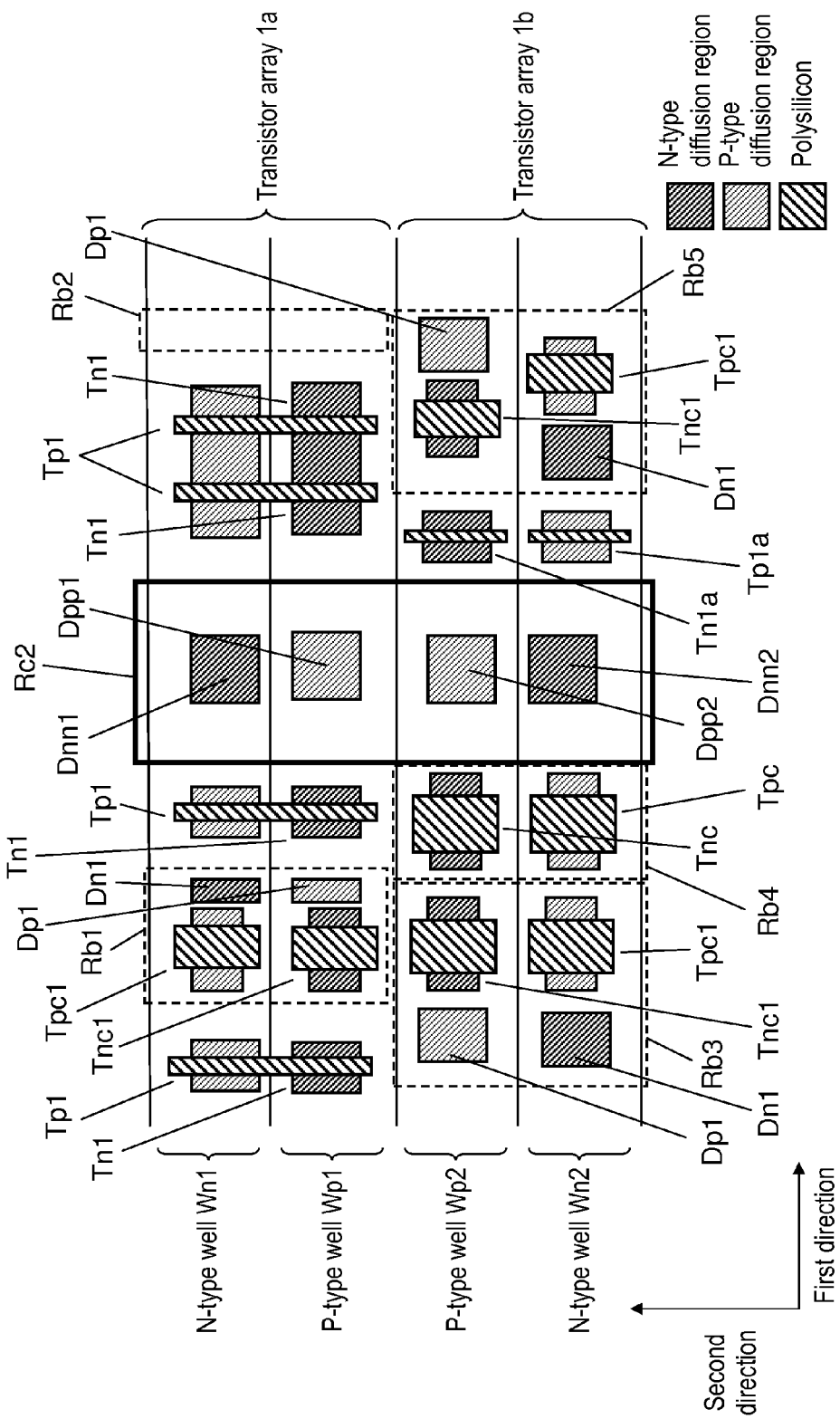
FIG. 3 is a schematic diagram illustrating a layout pattern of the semiconductor integrated circuit device according to the first exemplary embodiment.

FIG. 1 is a schematic diagram illustrating a layout pattern of a semiconductor integrated circuit device according to a first exemplary embodiment, and FIG. 2 is a schematic diagram illustrating a layout pattern in which a decoupling capacitance element is disposed in a margin region of the semiconductor integrated circuit device in FIG. 1. FIG. 3 is a schematic diagram illustrating a layout pattern of the semiconductor integrated circuit device according to the first exemplary embodiment.

As illustrated in FIG. 1, circuit elements are disposed in a first direction, and transistor arrays $1a$, $1b$, $1c$, ... are formed. Semiconductor integrated circuit Ri is formed by arranging the transistor arrays $1a$, $1b$, $1c$, ... in the second direction. Substrate contact regions Rc1, Rc2, and Rc3 extend in the second direction in semiconductor integrated circuit Ri, and substrate contacts are formed in substrate contact regions Rc1, Rc2, and Rc3 in a line in the second direction. In the present exemplary embodiment, substrate contact regions Rc1, Rc2, and Rc3 are regularly disposed at equal spaces. In FIG. 1, the space between adjacent substrate contact regions Rc1, Rc2, and Rc3 is $2d$ (illustrated in FIG. 1), which means the space between the substrate contact regions in the first direction is equal.

For example, in substrate contact region Rc2, substrate contacts Dnn1 and Dpp1 are formed on transistor array $1a$ (hereinafter referred to as a first substrate region), and a substrate contact (not illustrated) is also formed in an adjacent region in the second direction. Substrate contacts Dpp2 and Dnn2 are formed in an adjacent region in a direction opposite to the second direction.

The same applies to substrate contact regions Rc1 and Rc2 in FIG. 1. In semiconductor integrated circuit R1, the remaining regions other than substrate contact regions Rc1, Rc2, and Rc3 are classified into circuit element arrangement regions Ra1 to Ra4 required for an operation of the semiconductor integrated circuit, and regions (hereinafter referred to as margin regions Rb1, Rb2, Rb3, Rb4, and Rb5) other than the circuit element arrangement regions required for the operation.

Transistors (not illustrated) contributing to the logical operation are disposed in circuit element arrangement regions Ra1 to Ra4 required for the operation. Elements that do not contribute to the logical operation of the semiconductor integrated circuit, such as a decoupling capacitance element for suppressing power supply noise of the semiconductor integrated circuit, a filler cell, a repair transistor, a transistor having a potential fixing function (hereinafter referred to as time interval error (TIE) function), or an antenna diode, are disposed in margin regions Rb1, Rb2, Rb3, Rb4, and Rb5. Alternatively, no elements are disposed, or a dummy transistor or only a gate is disposed in margin regions Rb1, Rb2, Rb3, Rb4, and Rb5.

As apparent from the above description, elements other than transistors are disposed on the transistor array.

Next, a structure of margin region Rb will be described in detail with reference to FIGS. 2 and 3. FIG. 2 is a diagram illustrating a part of transistor array $1a$ and transistor array $1b$ in FIG. 1, and FIG. 3 is a schematic diagram illustrating a layout pattern of the semiconductor integrated circuit device according to the first exemplary embodiment. In FIG. 2, transistor array $1a$ includes a pair of N-type well Wn1 and P-type well Wp1. A P-type diffusion region is formed in N-type well Wn1 to form P-type MOS transistor Tp1. An N-type diffusion region is formed in P-type well Wp1 to form N-type MOS transistor Tn1. P-type MOS transistor Tp1 and N-type MOS transistor Tn1 are both transistors contributing to the logical operation. Transistor array $1b$ has the same structure. In FIG. 2, transistors Tnc and Tpc that function as decoupling capacitances not contributing to the operation of the semiconductor integrated circuit are formed in margin regions Rb1, and Rb3 to Rb5 enclosed by a dotted line. Margin region Rb2 is a free region.

In substrate contact region Rc2 on transistor array 1a, an N-type diffusion region is formed in N-type well Wn1 to form substrate contact Dnn1. In substrate contact region Rc2 on transistor array 1a, a P-type diffusion region is formed in P-type well Wp1 to form substrate contact Dpp1. P-type MOS transistor Tp1 or N-type MOS transistor Tn1 forming a circuit required for the operation of the semiconductor integrated circuit is disposed in the region other than margin regions Rb1 and Rb2 and substrate contact region Rc2 on transistor array 1a. Gate electrodes of P-type MOS transistor Tp1 and N-type MOS transistor Tn1 (transistors contributing to the logical operation) may be connected to each other in one transistor array, or gates may not be connected as in transistor Tp1a and transistor Tn1a disposed in transistor array 1b.

In general, transistor Tnc or Tpc serving as the decoupling capacitance is disposed in the margin region as illustrated in FIG. 2. However, in the first exemplary embodiment, transistor Tnc1 serving as the decoupling capacitance and substrate contact Dp1 are disposed as a pair on P-type well Wp1 or P-type well Wp2 in margin regions Rb1, Rb3, and Rb5 as illustrated in FIG. 3. Transistor Tpc1 serving as the decoupling capacitance and substrate contact Dn1 are disposed as a pair on N-type well Wn1 or N-type well Wn2 in margin regions Rb1, Rb3, and Rb5.

The structure other than margin regions Rb1, Rb3, and Rb5 is the same as the structure in FIG. 2. Therefore, same numerals are given, and the redundant description will not be made.

Specifically, in the first exemplary embodiment, the pair of the transistor serving as the decoupling capacitance and the substrate contact is disposed as illustrated in FIG. 3, instead of transistors Tnc and Tpc serving as the decoupling capacitance. This structure can suppress latch-up without increasing an area of the semiconductor integrated circuit for arranging the substrate contact. Since the decoupling capacitance element and the substrate contact region are mixed, this structure can assure a lot of substrate contact regions, and suppress latch-up without significantly deteriorating the decoupling capacitance.

In the first exemplary embodiment described with reference to FIG. 3, the area of the diffusion region for forming substrate contact Dn1 is different between margin region Rb1 and margin region Rb3. As described above, the area of the diffusion region for forming the substrate contact can be adjusted for assuring a necessary substrate contact region, according to need. The same as substrate contact Dn1 applies to substrate contact Dp1.

In the first exemplary embodiment, substrate contacts Dnn2 and Dpp2 are formed on transistor array 1b (hereinafter referred to as a first substrate region) in substrate contact region Rc2 as illustrated in FIG. 3, for example. Substrate contact Dpp1 is formed in the region adjacent to the first substrate region in the second direction. A substrate contact is formed in the region adjacent to the first substrate region in a direction opposite to the second direction (not illustrated). In other words, substrate contact regions are disposed in the regions adjacent to the first substrate contact region in the second direction and in the direction opposite to the second direction.

The same applies to substrate contact regions Rc1 and Rc3 (illustrated in FIG. 1).

As illustrated in FIG. 3, substrate contacts Dn1 and Dp1 are formed in margin region Rb5 on transistor array 1b, but no substrate contact region is formed in the region adjacent to margin region Rb5 in the second direction. No substrate contact region is formed in the region adjacent to margin region Rb5 in the direction opposite to the second direction (not illustrated). For example, in FIG. 3, margin region Rb5 becomes the third substrate contact region. Margin region Rb1 and margin region Rb3 are also substrate contact regions.

Second Exemplary Embodiment

Figure 4:
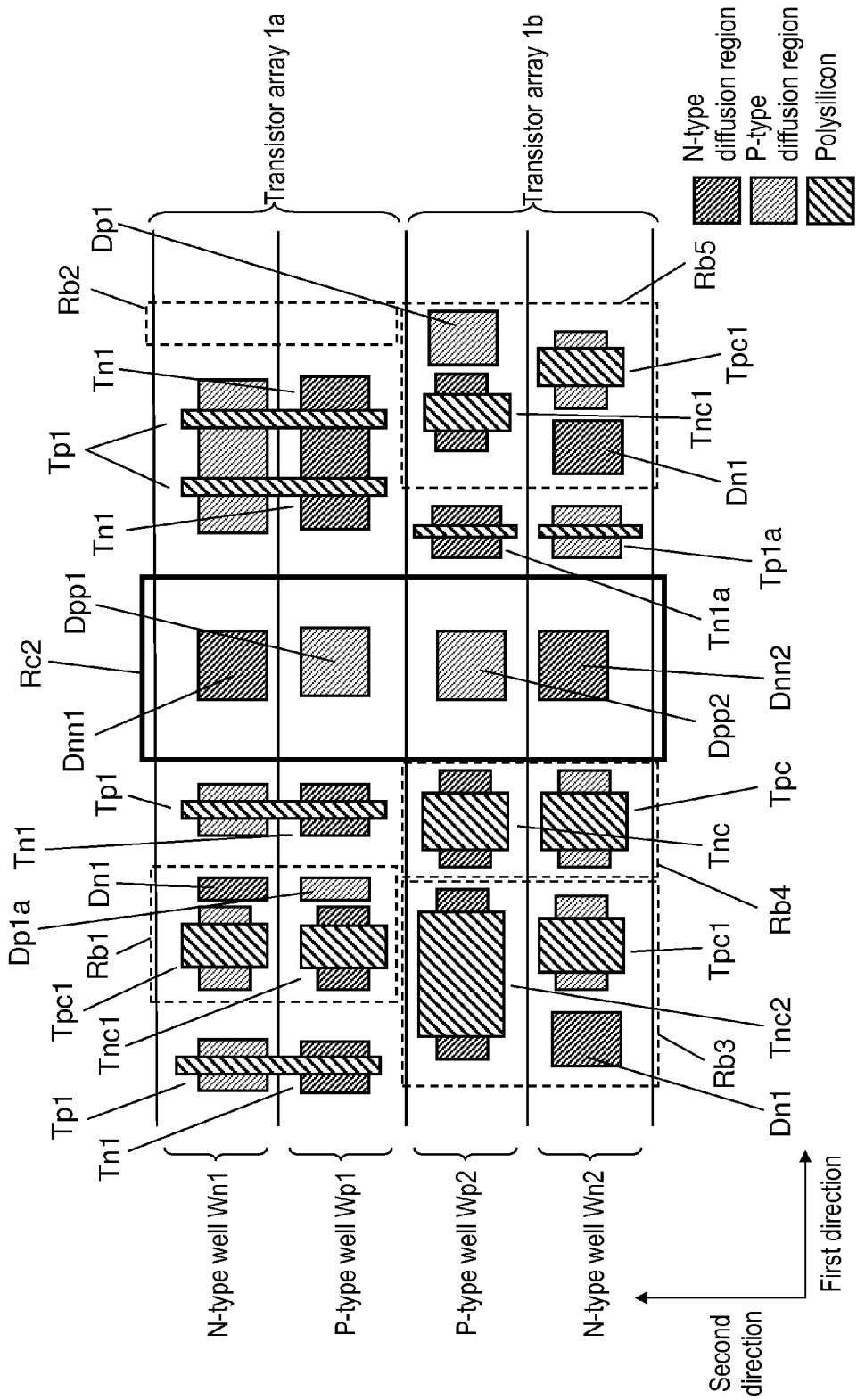
FIG. 4 is a schematic diagram illustrating a layout pattern of a semiconductor integrated circuit device according to a second exemplary embodiment.

A second exemplary embodiment will be described next with reference to FIG. 4. FIG. 4 is a schematic diagram illustrating a layout pattern of a semiconductor integrated circuit device according to the second exemplary embodiment. The different point between the layout pattern illustrated in FIG. 4 and the layout pattern according to the first exemplary embodiment described with reference to FIG. 3 is only margin region Rb3. Therefore, the structure of only margin region Rb3 will be described. The other configurations are identified with the same numerals, and the redundant description will not be made.

As illustrated in FIG. 4, only transistor Tnc2 serving as the decoupling capacitance is formed on P-type well Wp2 in margin region Rb3, while a pair of transistor Tpc1 serving as the decoupling capacitance and substrate contact Dn1 is disposed on N-type well Wn2 as in FIG. 3. The transistor serving as the decoupling capacitance is composed of a CMOS transistor in the present exemplary embodiment.

According to this configuration, substrate contact Dp1a formed on P-type well Wp1 in margin region Rb1 supplies a substrate potential to the adjacent N-type MOS transistor in P-type well Wp2, and acts as a deterrent against latch-up. Therefore, substrate contact region Dp1a is effective not only for N-type MOS transistor Tnc1, but also for N-type MOS transistor Tnc2 in margin region Rb3. Accordingly, there is less need to arrange the substrate contact region made of the P-type diffusion region in the margin region Rb3. Only substrate contact Dn1 made of the N-type diffusion region may be disposed, for example.

Since the substrate contact region in each margin region is disposed only at a necessary portion from the viewpoint of deterrent against latch-up, i.e., the substrate contact region is disposed at either of the N-type well and the P-type well in the margin region, the decoupling capacitance can be maximally utilized, and a lot of substrate contact regions can be assured, while utilizing the margin region. Thus, the latch-up can be suppressed.

Third Exemplary Embodiment

Figure 5:
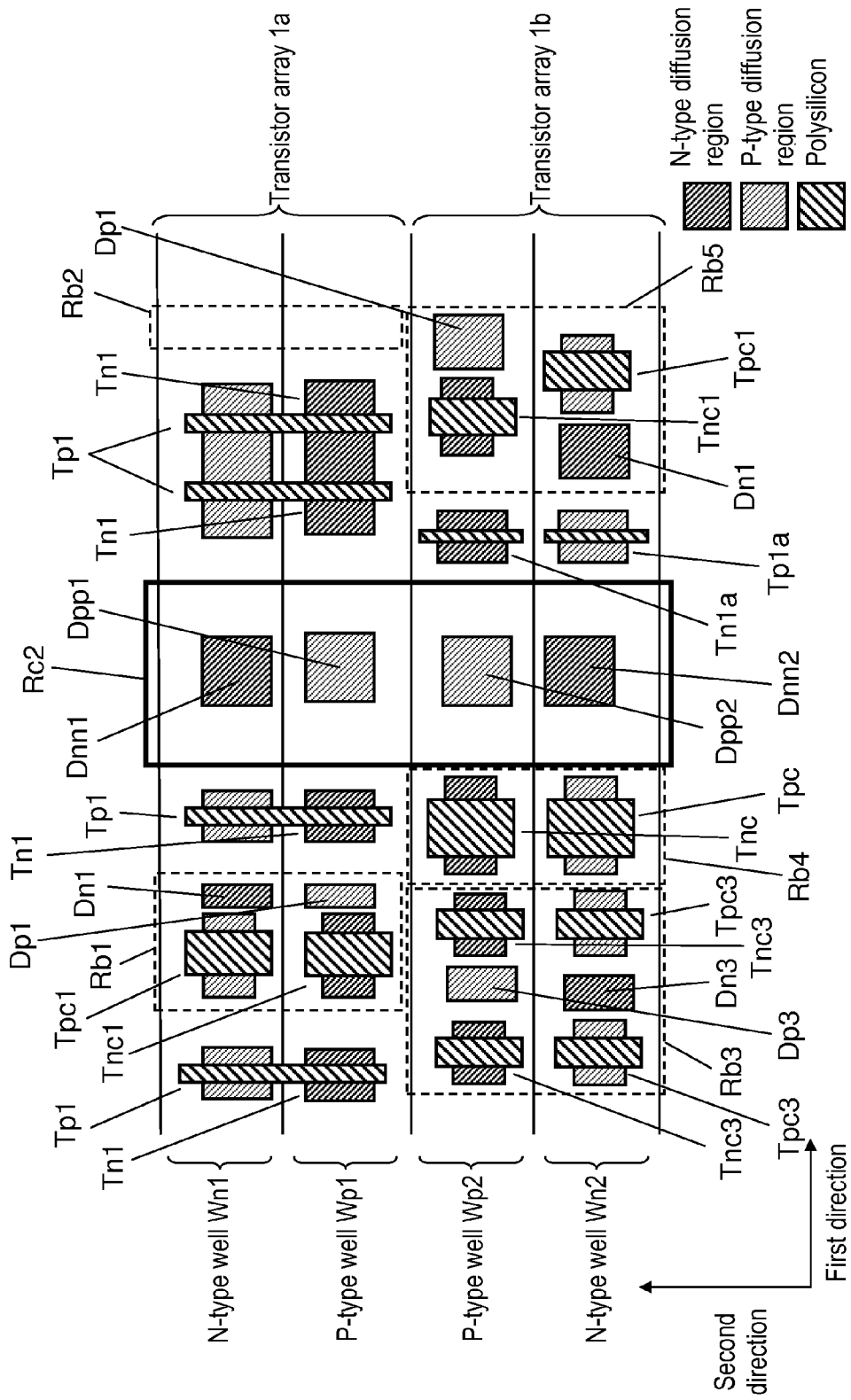
FIG. 5 is a schematic diagram illustrating a layout pattern of a semiconductor integrated circuit device according to a third exemplary embodiment.

A third exemplary embodiment will next be described with reference to FIG. 5. FIG. 5 is a schematic diagram illustrating a layout pattern of a semiconductor integrated circuit device according to the third exemplary embodiment. The different point between the layout pattern illustrated in FIG. 5 and the layout pattern according to the first exemplary embodiment described with reference to FIG. 3 is only margin region Rb3. Therefore, the structure of only margin region Rb3 will be described. The other configurations are identified with the same numerals, and the redundant description will not be made.

In the first exemplary embodiment described with reference to FIG. 3, substrate contacts Dp1 and Dn1 are concentrated in margin region Rb3. In the case where the regions of N-type MOS transistor Tnc1 and P-type MOS transistor Tpc1 are large, the distance between substrate contacts Dpp2 and Dnn2 and substrate contacts Dp1 and Dn1 increases, so that the effect of preventing latch-up is slightly deteriorated.

On the other hand, in the third exemplary embodiment, substrate contacts Dp3 and Dn3 are disposed in the center of margin region Rb3, and the CMOS transistor is divided into two N-type MOS transistors Tnc3 and two P-type MOS transistors Tpc3, as illustrated in FIG. 5.

In FIG. 5, margin region Rb1, margin region Rb3, and margin region Rb5 are the substrate contact regions.

Since the effect of preventing latch-up is uniformly exerted on the neighboring CMOS transistors from substrate contact Dp3 or Dn3 in the margin region as described above, latch-up can surely be prevented without a decrease in the decoupling capacitance.

Fourth Exemplary Embodiment

Figure 6:
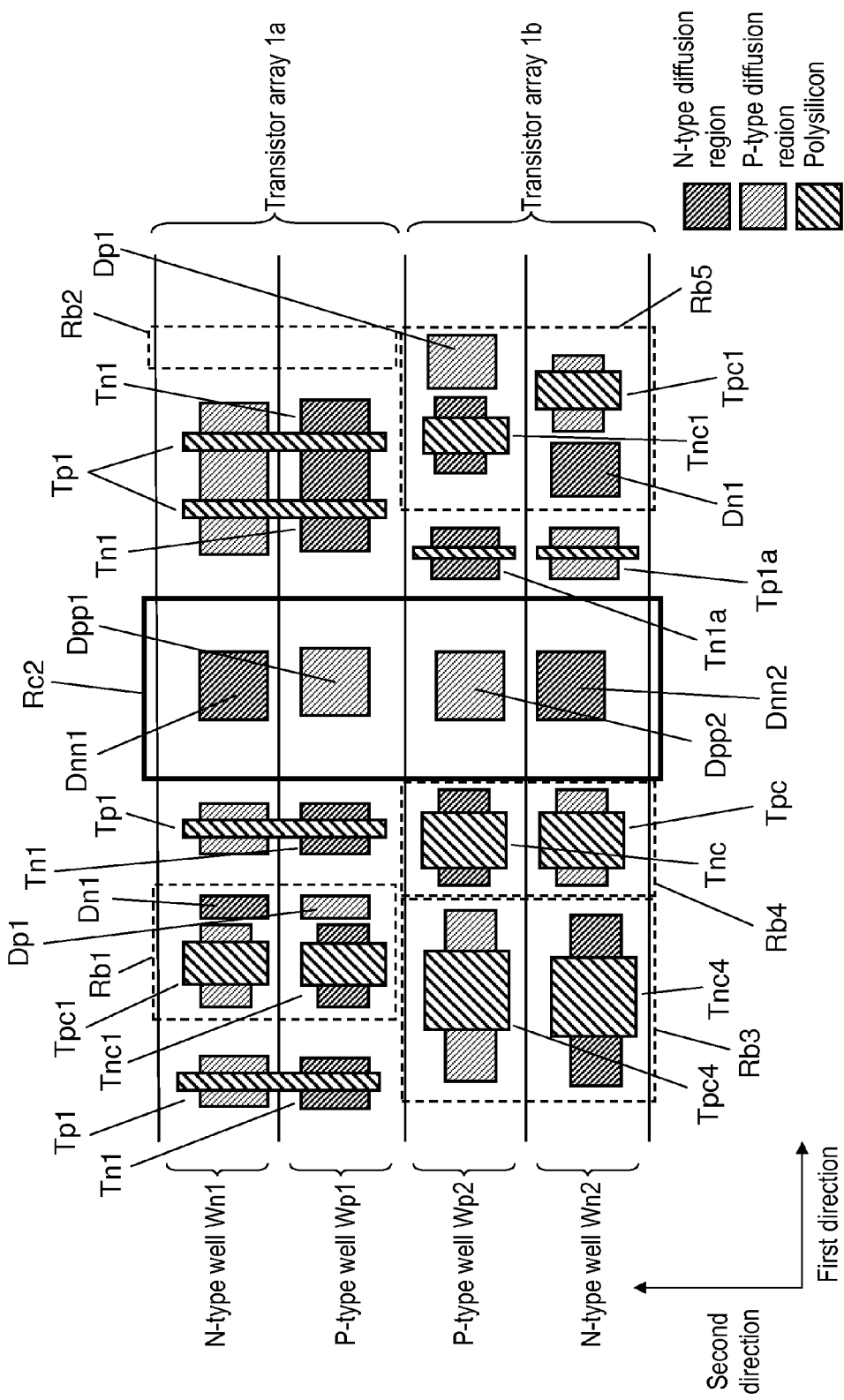
FIG. 6 is a schematic diagram illustrating a layout pattern of a semiconductor integrated circuit device according to a fourth exemplary embodiment.

A fourth exemplary embodiment will next be described with reference to FIG. 6. FIG. 6 is a schematic diagram illustrating a layout pattern of a semiconductor integrated circuit device according to the fourth exemplary embodiment. The different point between the layout pattern illustrated in FIG. 6 and the layout pattern according to the first exemplary embodiment described with reference to FIG. 3 is only margin region Rb3. Therefore, the structure of only margin region Rb3 will be described. The other configurations are identified with the same numerals, and the redundant description will not be made.

In the semiconductor integrated circuit illustrated in FIG. 6, P-type MOS transistor Tpc4 is formed on P-type well Wp2 in margin region Rb3, and N-type MOS transistor Tnc4 is formed on N-type well Wn2 in margin region Rb3. According to this configuration, P-type MOS transistor Tpc4 and N-type MOS transistor Tnc4 have a function of the substrate contact in addition to the function of the decoupling capacitance.

In FIG. 6, margin region Rb1 and margin region Rb5 are the substrate contact regions.

Therefore, the decoupling capacitance and the substrate contact region can be disposed with high density in the margin region, whereby latch-up can surely be prevented without a decrease in the decoupling capacitance.

Fifth Exemplary Embodiment

Figure 7:
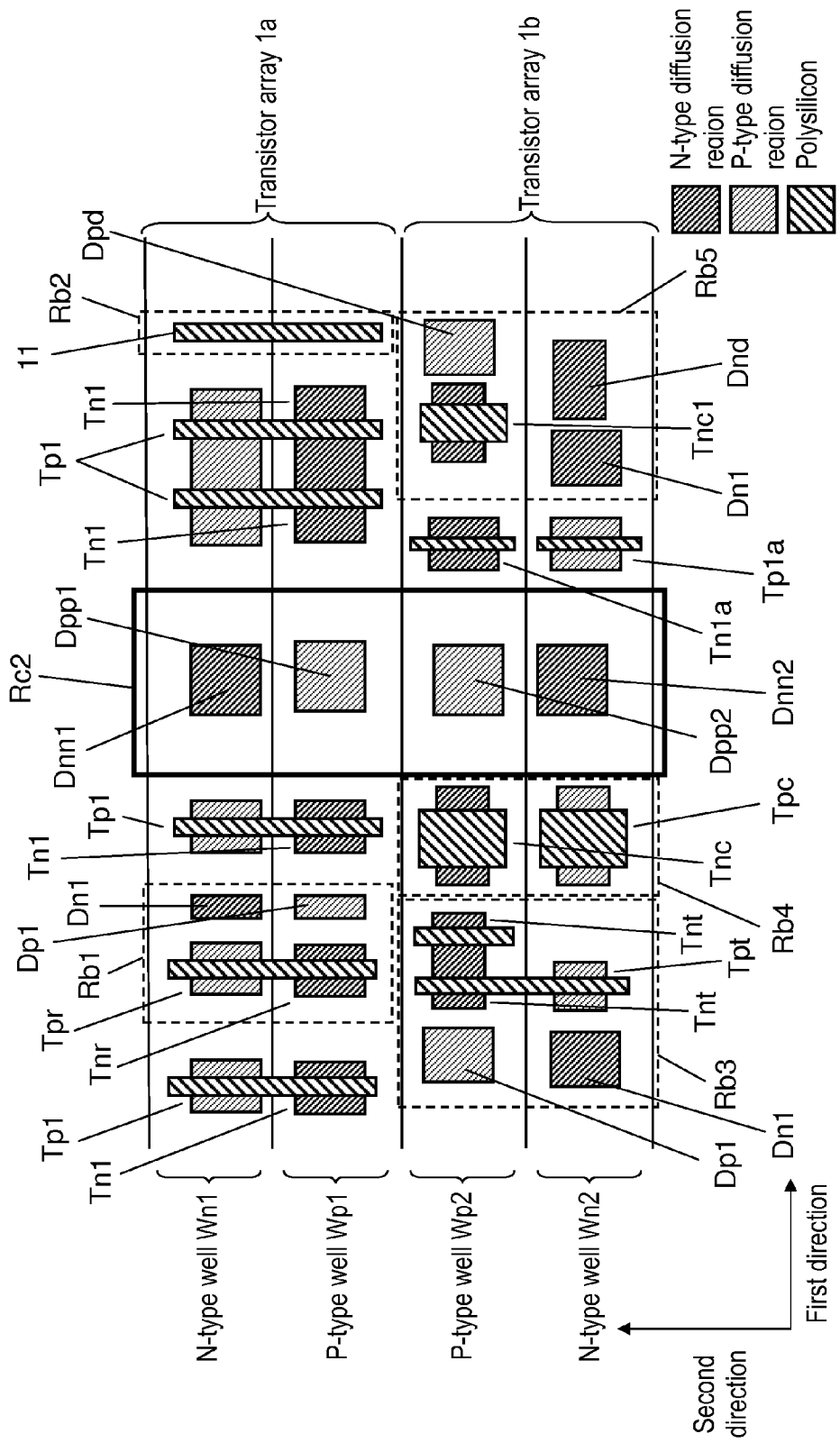
FIG. 7 is a schematic diagram illustrating a layout pattern of a semiconductor integrated circuit device according to a fifth exemplary embodiment.

FIG. 7 is a schematic diagram illustrating a layout pattern of a semiconductor integrated circuit device according to a fifth exemplary embodiment. In FIG. 7, margin regions Rb1, Rb2, Rb3, and Rb5 in FIG. 3 are changed as described below. The other configurations are identified with the same numerals, and the redundant description will not be made.

Margin region Rb1 will firstly be described. P-type MOS transistor Tpr and N-type MOS transistor Tnr disposed in margin region Rb1 are repair transistors. Specifically, they are auxiliary elements prepared for repairing malfunction of the integrated circuit, and they do not generally contribute to the logical operation of the integrated circuit. The repair transistors have fixed potential or they are in a floating state, when the integrated circuit does not need to be repaired.

Next, margin region Rb2 will be described. In the embodiments described above, margin region Rb2 is a free region. However, as illustrated in FIG. 7, only gate 11 is disposed to allow margin region Rb2 to be used as a dummy gate arrangement region. It is not limited to arrange only the gate. In a free space, a gate may be disposed on a diffusion region, and a dummy transistor (dummy transistor) may be disposed. The dummy transistor is different from N-type MOS transistor Tn1 or P-type MOS transistor Tp1 in that the dummy transistor is in the floating state, and does not contribute to the logical operation of the semiconductor integrated circuit, although it has the structure same as that of N-type MOS transistor Tn1 or P-type MOS transistor Tp1.

Next, margin region Rb3 will be described. P-type MOS transistor Tpt and N-type MOS transistor Tnt in margin region Rb3 are transistors having a TIE function, i.e., a function of indirectly connecting the power supply potential or the ground potential to other node in the integrated circuit. P-type MOS transistor Tpt and N-type MOS transistor Tnt do not contribute to the logical operation of the semiconductor integrated circuit.

Next, margin region Rb5 will be described. P-type diffusion region Dpd and N-type diffusion region Dnd in margin region Rb5 are antenna diodes. The antenna diode has a function of escaping charges from a wiring layer in order to prevent charges excessively electrified in the wiring layer from applying damage to the elements in the integrated circuit. The antenna diode does not contribute to the logical operation of the integrated circuit. N-type MOS transistor Tnc1 in margin region Rb5 is the decoupling capacitance element, and does not contribute to the logical operation of the integrated circuit.

The configuration in which not only the decoupling capacitance element but also any one or a combination of the elements, such as the repair transistor, the transistor having the TIE function, and the antenna diode, which do not contribute to the logical operation of the integrated circuit are disposed can assure a lot of substrate contact regions without significantly deteriorating the function of each element not contributing to the logical operation, while utilizing the margin region. Thus, this configuration can prevent latch-up.

In FIG. 7, margin region Rb1, margin region Rb3, and margin region Rb5 are substrate contact regions.

Sixth Exemplary Embodiment

In the exemplary embodiments described above, only substrate contacts Dnn1, Dpp1, Dnn2, and Dpp2 are formed in substrate contact region Rc2. However, in a sixth exemplary embodiment, not only the substrate contact but also elements that do not contribute to the logical operation are formed in substrate contact region Rc2. The other configurations same as those shown in FIG. 3 are identified with the same numerals, and the redundant description will not be made.

Figure 9:
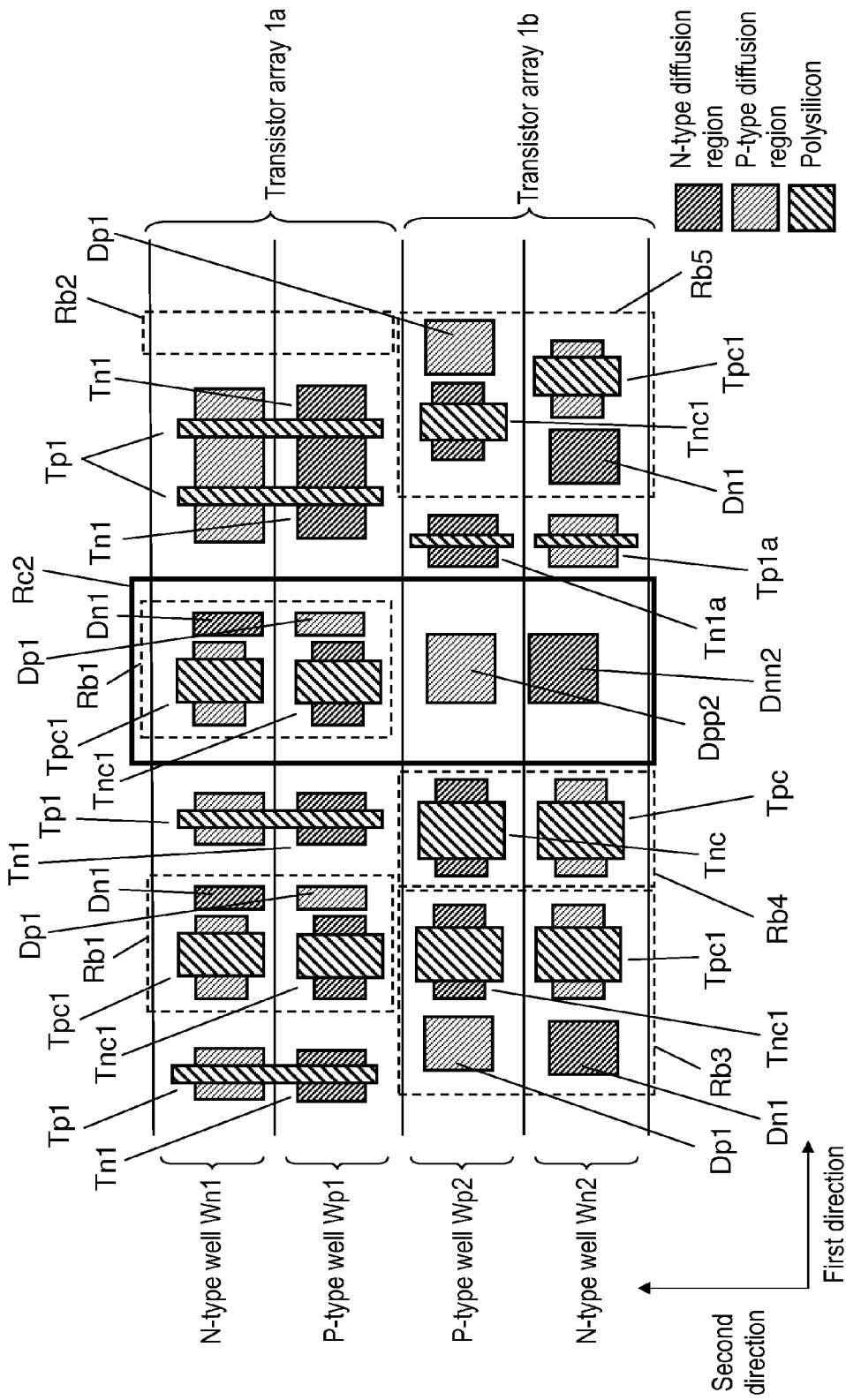
FIG. 9 is a schematic diagram illustrating a layout pattern of a semiconductor integrated circuit device according to a sixth exemplary embodiment.

FIG. 9 is a schematic diagram illustrating a layout pattern of a semiconductor integrated circuit device according to the sixth exemplary embodiment. In FIG. 9, the region where substrate contact Dnn1 and substrate contact Dpp1 in FIG. 3 are formed is replaced by margin region Rb1 in FIG. 3.

Specifically, in substrate contact region Rc2, transistor Tpc1 serving as the decoupling capacitance is disposed on the left side of substrate contact Dn1. Transistor Tnc1 serving as the decoupling capacitance is disposed on the left side of substrate contact Dp1.

Figure 10:
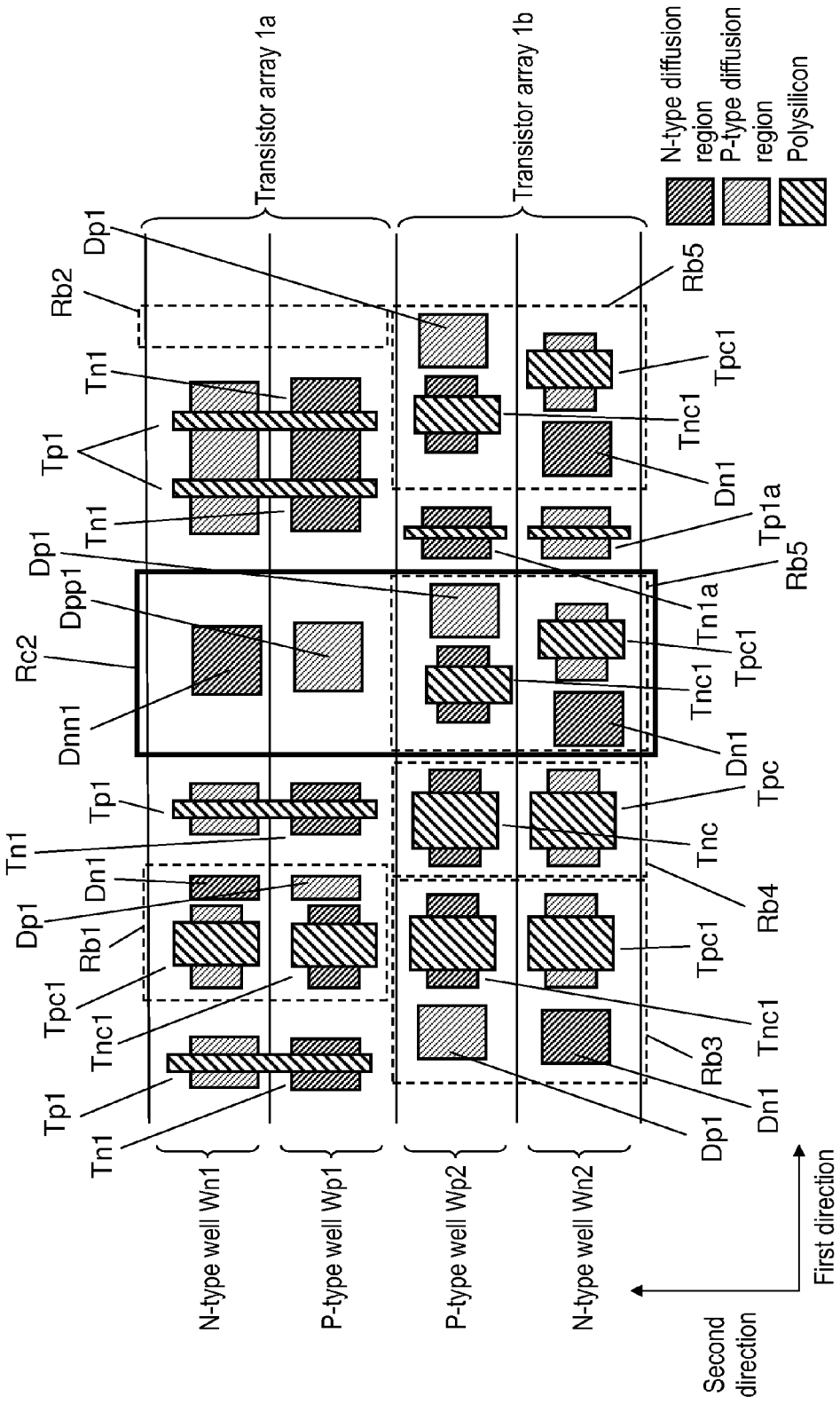
FIG. 10 is a schematic diagram illustrating another layout pattern of the semiconductor integrated circuit device according to the sixth exemplary embodiment.

FIG. 10 is a schematic diagram illustrating another layout pattern of the semiconductor integrated circuit device according to the sixth exemplary embodiment. In FIG. 10, the region where substrate contact Dnn2 and substrate contact Dpp2 in FIG. 3 are formed is replaced by margin region Rb5 in FIG. 5.

Specifically, in substrate contact region Rc2, transistor Tpc1 serving as the decoupling capacitance is disposed on the right side of substrate contact Dn1. Transistor Tnc1 serving as the decoupling capacitance is disposed on the left side of substrate contact Dp1.

Figure 11:
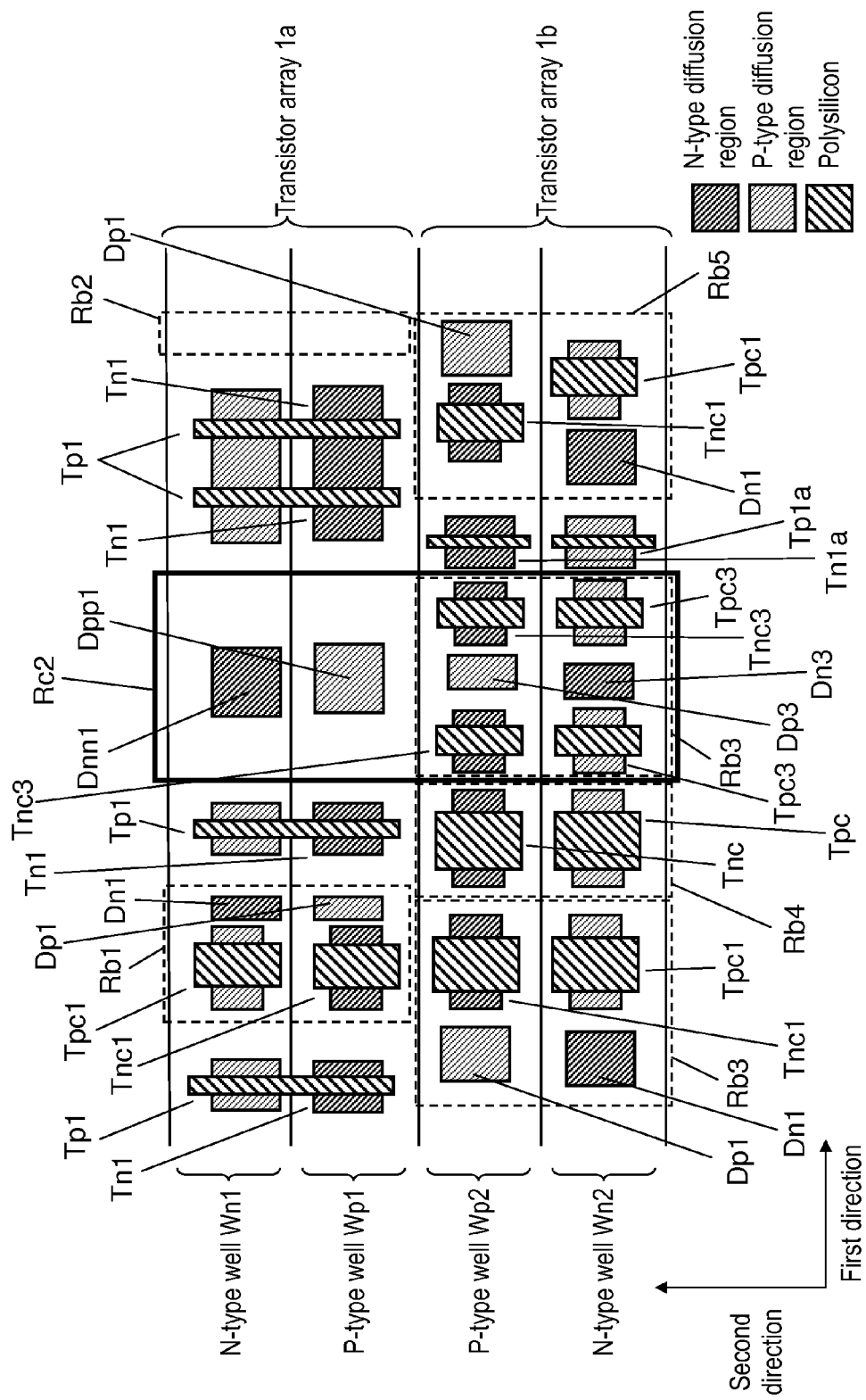
FIG. 11 is a schematic diagram illustrating a layout pattern of the semiconductor integrated circuit device according to the sixth exemplary embodiment.
Figure 12:
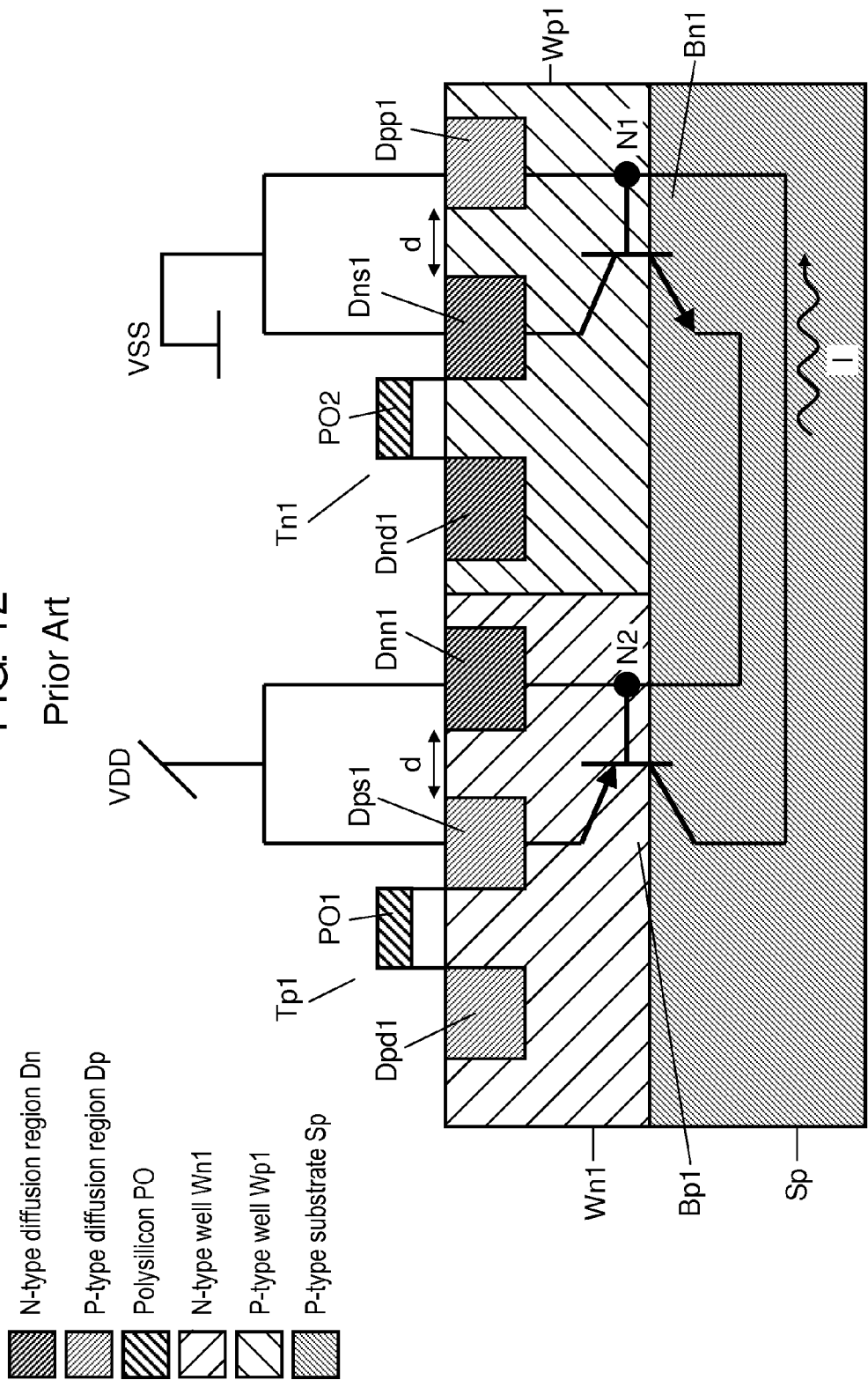
FIG. 12 is a diagram illustrating a sectional structure of a conventional semiconductor integrated circuit device.

FIG. 11 is a schematic diagram illustrating another layout pattern of the semiconductor integrated circuit device according to the sixth exemplary embodiment. In FIG. 11, the region where substrate contact Dnn2 and substrate contact Dpp2 in FIG. 3 are formed is replaced by margin region Rb3 in FIG. 5.

Specifically, in substrate contact region Rc2, transistor Tpc3 serving as the decoupling capacitance is disposed on both sides of substrate contact Dn3. Transistor Tnc3 serving as the decoupling capacitance is disposed on both sides of substrate contact Dp3.

Specifically, not only the substrate contact but also the transistor that does not contribute to the operation may be disposed in substrate contact region Rc2.

The repair transistor as illustrated in Rb1 in FIG. 7 may be disposed in substrate contact region Rc2 as the element that does not contribute to the operation. The antenna diode Dnd illustrated in Rb5 in FIG. 7 may also be disposed.

Figure 8:
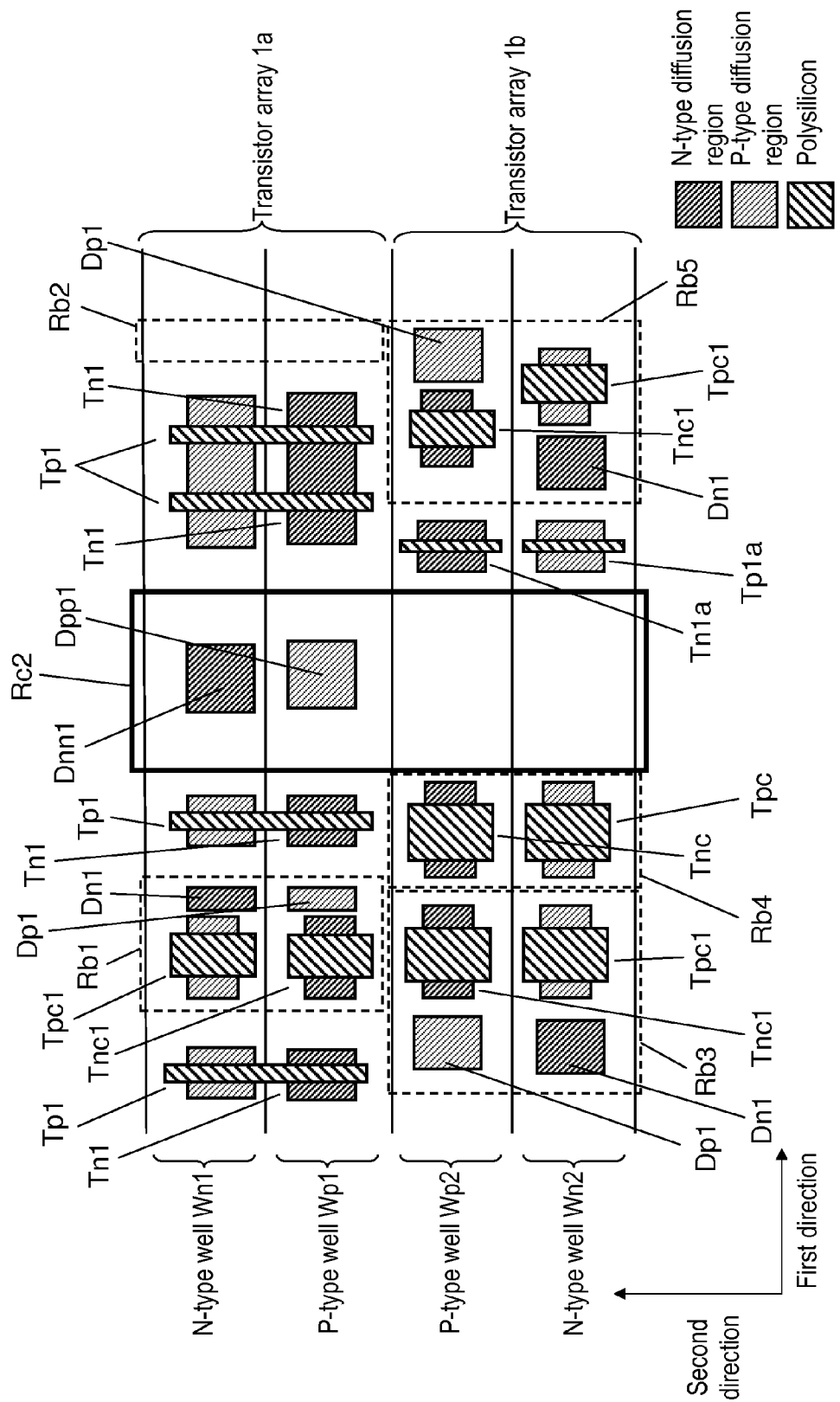
FIG. 8 is a schematic diagram of a layout pattern of a semiconductor integrated circuit device, illustrating another arrangement example of a substrate contact according to the exemplary embodiment.

In the present exemplary embodiment, substrate contacts are disposed in a line in substrate contact region Rc2. However, the substrate contacts may alternately be disposed, or some substrate contacts may be culled. For example, FIG. 8 is a schematic diagram illustrating another arrangement example of substrate contacts in a layout pattern of a semiconductor integrated circuit of the present exemplary embodiment. As illustrated in FIG. 8, the substrate contacts are not necessarily formed on all transistor arrays.

In the present exemplary embodiments, the transistors are all MOS transistors. However, the invention is not limited thereto.

The semiconductor integrated circuit device according to the present disclosure can assure a lot of substrate contact regions without increasing an area of the entire integrated circuit, thereby being capable of realizing a high-integrated circuit with latch-up being prevented more.

What is claimed is:

1. A semiconductor integrated circuit device comprising:
    a plurality of transistors contributing to a logical operation;
    an element that does not contribute to the logical operation; and
    first, second, and third substrate contact regions supplying a substrate potential to the plurality of transistors,
    wherein the semiconductor integrated circuit device includes a plurality of transistor arrays extending in a first direction and being disposed in a line in a second direction orthogonal to the first direction,
    wherein each of the plurality of transistor arrays includes the plurality of transistors, the element that does not contribute to the logical operation, the first substrate contact region, the second substrate contact region, and the third substrate contact region disposed between the first substrate contact region and the second substrate contact region,
    a substrate contact region is disposed in a region adjacent to the first substrate contact region in the second direction and in a region adjacent to the first substrate contact region in a direction opposite to the second direction,
    a substrate contact region is disposed in a region adjacent to the second substrate contact region in the second direction and in a region adjacent to the second substrate contact region in a direction opposite to the second direction,
    no substrate contact region is disposed in a region adjacent to the third substrate contact region in the second direction and in a region adjacent to the third substrate contact region in a direction opposite to the second direction, and
    the element that does not contribute to the logical operation is disposed in a region adjacent to the third substrate contact region in the first direction.

2. The semiconductor integrated circuit device according to claim 1, wherein
    the third substrate contact region has at least one of structures in which:
    (1) an N-type impurity diffusion region is formed on an N well, and
    (2) a P-type impurity diffusion region is formed on a P well.

3. The semiconductor integrated circuit device according to claim 1, wherein
    the element that does not contribute to the logical operation is a transistor serving as a capacitance.

4. The semiconductor integrated circuit device according to claim 1, wherein
    the element that does not contribute to the logical operation is any one of an antenna diode, a transistor having a fixed potential, and a transistor that is in a floating state.

5. The semiconductor integrated circuit device according to claim 1, further comprising a fourth substrate contact region, wherein
    a space between the first substrate contact region and the second substrate contact region is equal to a space between the second substrate contact region and the fourth substrate contact region.

6. The semiconductor integrated circuit device according to claim 1, further comprising a fourth substrate contact region, wherein
    no substrate contact region is disposed in a region adjacent to the fourth substrate contact region in the second direction and in a region adjacent to the fourth substrate contact region in a direction opposite to the second direction,
    the element that does not contribute to the logical operation is disposed in a region adjacent to the fourth substrate contact region in the first direction, and
    an area of a diffusion region forming the third substrate contact region is different from an area of a diffusion region forming the fourth substrate contact region.

7. The semiconductor integrated circuit device according to claim 1, wherein
    at least one of the first substrate contact region and the second substrate contact region further includes an element that does not contribute to an operation.

8. The semiconductor integrated circuit device according to claim 7, wherein
    the element that does not contribute to the logical operation is a transistor serving as a capacitance.

9. The semiconductor integrated circuit device according to claim 7, wherein
    the element that does not contribute to the logical operation is any one of an antenna diode, a transistor having a fixed potential, and a transistor that is in a floating state.

* * * * *